United States Patent
Chua et al.

(10) Patent No.: US 7,714,340 B2
(45) Date of Patent: May 11, 2010

(54) NITRIDE LIGHT-EMITTING DEVICE

(75) Inventors: Christopher L. Chua, San Jose, CA (US); Zhihong Yang, Sunnyvale, CA (US); Noble M. Johnson, Menlo Park, CA (US); Mark R. Teepe, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 312 days.

(21) Appl. No.: 11/516,333

(22) Filed: Sep. 6, 2006

(65) Prior Publication Data

US 2008/0123711 A1  May 29, 2008

(51) Int. Cl.
*H01L 33/00* (2006.01)
*H01L 29/22* (2006.01)
*H01L 29/227* (2006.01)
(52) U.S. Cl. .................... 257/98; 438/29; 438/294
(58) Field of Classification Search ............... 257/98; 438/29, 294
See application file for complete search history.

(56) References Cited

U.S. PATENT DOCUMENTS

| 6,233,265 | B1 | 5/2001 | Bour et al. |
| 6,618,413 | B2 | 9/2003 | Bour et al. |
| 7,078,735 | B2* | 7/2006 | Shono et al. .................. 257/98 |
| 7,119,372 | B2* | 10/2006 | Stokes et al. .................. 257/79 |
| 7,384,808 | B2* | 6/2008 | Liu et al. ...................... 438/29 |
| 2004/0119403 | A1* | 6/2004 | McCormick et al. ......... 313/506 |
| 2006/0237739 | A1* | 10/2006 | Shono et al. .................. 257/98 |
| 2006/0273336 | A1* | 12/2006 | Fujikura et al. ............... 257/98 |
| 2007/0012937 | A1* | 1/2007 | Liu et al. ....................... 257/99 |
| 2007/0187712 | A1* | 8/2007 | Yamada et al. ............... 257/103 |
| 2008/0057604 | A1* | 3/2008 | Tanaka .......................... 438/29 |
| 2008/0237620 | A1* | 10/2008 | Shiue et al. .................... 257/98 |

* cited by examiner

Primary Examiner—Fernando L Toledo
(74) Attorney, Agent, or Firm—Fay Sharpe LLP

(57) ABSTRACT

A bottom-emitting nitride light-emitting device with enhanced light extraction efficiency is provided. The increased light output is provided by the reflector that redirects upward-going light towards the bottom output. A mesh contact area, in one form, spreads current across the entire carrier injection area without occupying the entire top surface of the device.

22 Claims, 3 Drawing Sheets

NITRIDE LIGHT-EMITTING DEVICE

BACKGROUND

Light Emitting Diodes (LEDs) take many different forms and are increasingly used in varied applications ranging from display backlighting, to traffic lights, to street signs, to indicator lamps, to general lighting, to UV curing of adhesives, to spectroscopy, and to water purification. In recent years, there have been significant technical advances leading to improved LED brightness. However, the ability to efficiently extract light out of LED structures has typically been a challenge in the design of high efficiency LEDs.

In the case of nitride-based UV LEDs, light is usually extracted out of the backside of the wafer because one or more layers above the light generating active layer are typically absorbing. Moreover, layers having high aluminum content in the nitride system are exceedingly resistive, so a current spreading top layer positioned above the current injection area of the wafer is typically used. Nitride-based light-emitting diodes (LEDs) usually feature such a top layer that fully covers the current injection area. This top layer can be an opaque metal or a transparent Indium Tin Oxide film. Its purpose is to spread current across the entire current injection area. It is also desirable to make these top layers highly reflecting, so upward going light can be reflected downward towards the backside or bottom output.

However, highly reflective top layers are difficult to attain. A good p-type contact requires that the noted current spreading metal contact layer that covers the entire current injection area of the device be alloyed to the p-type layer. The rough interface between the alloyed contact and the p-type layer causes large amounts of light scattering and absorption.

FIG. 1 shows a top view of a typical nitride-based LED 10 having a top p-contact layer 12 having a metal contact 14 formed thereon and an n-contact layer 16 having an n-contact pad 18. The p-contact layer 12 is covered by the metal contact 14 which is typically formed of a Ni/Au metal alloy formed thereon. This metal contact 14 is formed by initially depositing Ni and Au as separate metal layers. The layers are then annealed to alloy them into an underlying GaN epitaxial contact layer (not shown in FIG. 1). The metal contact 14 serves as a current spreading layer that distributes current across the entire current injection area. The alloyed interface between the metal contact and the underlying epitaxial layer allows electrical injection into the device. Unfortunately, as noted above, the alloying process results in a rough interface that scatters light and leads to low top-side reflectivity.

FIG. 2 shows a cross section illustration of the device 10 in FIG. 1. Light generated at an active region (e.g., the InAlGaN heterostructure multiple quantum well layers) within the epitaxial layers 20 is reflected by the top metal contact 14, so light has to be emitted out of the structure through the wafer backside (e.g., sapphire substrate 22 and AlN template 24). In the case of ultraviolet (UV) LEDs, a portion of the upward-directed light would be lost through absorption because the top contact layer 12 is absorbing. Although higher bandgap materials would be transparent to UV light, they are not well suited as contact layers because high aluminum-containing p-type AlGaN films are very resistive.

In connection with other technologies such as GaAs surface-emitting laser devices, the use of annular rings is not uncommon. However, for nitride based light emitting diodes contemplated above, if an annular ring were used as a top metal contact, the highly resistive upper p-type layers would prevent current from spreading into the center region of the device under the "hole" of the ring. Most of the current would be channeled into the area directly below the annular ring portion where the metal is alloyed to the layer below. This poor current distribution would result in most of the light being emitted from only those areas. Of course, it is desirable to emit light from the entire p-contact area, not just from areas below the location of the metal.

INCORPORATION BY REFERENCE

U.S. Pat. Nos. 6,233,265 and 6,618,413 are incorporated herein by reference in their entirety.

BRIEF DESCRIPTION

In one aspect of the presently described embodiments, a nitride-based light emitting device comprises a conductive layer disposed on a top epitaxial layer of the light emitting device, the conductive layer having defined therein a contact area having a plurality of apertures and a reflector aligned with the contact area.

In another aspect of the presently described embodiments, the metal layer is alloyed to the epitaxial layer.

In another aspect of the presently described embodiments, the conductive layer comprises a metal.

In another aspect of the presently described embodiments, the conductive layer comprises a conductive oxide.

In another aspect of the presently described embodiments, the reflector comprises a metal.

In another aspect of the presently described embodiments, the reflector comprises a dielectric.

In another aspect of the presently described embodiments, the reflector comprises at least one of silver, aluminum, gold, $SiO_2$, $Si_3N_4$, $ZrO_2$, $HfO_2$, $TiO_2$, $Ta_2O_5$, $Al_2O_3$, ZnO, and ITO. The actual elemental compositions can vary from the nominal values indicated.

In another aspect of the presently described embodiments, the plurality of apertures defines a mesh pattern in the contact area.

In another aspect of the presently described embodiments, the plurality of apertures defines a radially symmetric grid pattern in the contact area.

In another aspect of the presently described embodiments, the device is a light emitting diode.

In another aspect of the presently described embodiments, the device is a vertical-cavity laser.

In another aspect of the presently described embodiments, a light emitting device comprises a substrate layer, a template layer positioned on the substrate layer, a plurality of nitride-based epitaxial layers on the template layer comprising a light generating active layer and a contact layer, a conductive layer on the contact layer, the conductive layer being operative to conduct current and to excite the active layer to generate the light, and the conductive layer having defined therein a contact area having at least one aperture, and, a reflector aligned with the contact area, the reflector being operative to reflect the generated light through the contact area, the epitaxial layer, the template layer and the substrate layer.

In another aspect of the presently described embodiments, the template layer comprises $Al_xGa_{1-x}N$, where $0 \leq x \leq 1$.

In another aspect of the presently described embodiments, the conductive layer comprises a conductive oxide.

In another aspect of the presently described embodiments, the conductive layer comprises a metal.

In another aspect of the presently described embodiments, the reflector comprises at least one of silver, aluminum and gold.

In another aspect of the presently described embodiments, the reflector comprises a dielectric material.

In another aspect of the presently described embodiments, the reflector comprises at least one of $SiO_2$, $Si_3N_4$, $ZrO_2$, $HfO_2$, $TiO_2$, $Ta_2O_5$, $Al_2O_3$, ZnO and ITO material. The actual relative percentages of elements in the compounds can differ from the nominal values given.

In another aspect of the presently described embodiments, the reflector comprises alternating layers of dielectric material.

In another aspect of the presently described embodiments, the at least one aperture defines a mesh pattern in the contact area.

In another aspect of the presently described embodiments, the at least one aperture defines a radially symmetric grid pattern in the contact area.

In another aspect of the presently described embodiments, the device is a light emitting diode.

In another aspect of the presently described embodiments, the device is a vertical-cavity laser.

In another aspect of the presently described embodiments, a method comprises depositing a conductive layer on an epitaxial layer such that the conductive layer has defined therein a contact area having a plurality of apertures and forming a reflector on the metal layer, the reflector being aligned with the plurality of apertures of the contact area.

In another aspect of the presently described embodiments, the plurality of apertures defines a mesh pattern in the contact area.

In another aspect of the presently described embodiments, the plurality of apertures defines a radially symmetric grid pattern in the contact area.

DETAILED DESCRIPTION

The presently described embodiments disclose device structures that have highly reflective top layers to enhance the light extraction efficiency of light emitting devices such as LEDs. According to the presently described embodiments, the light extraction efficiency of backside-emitting nitride LEDs can be significantly improved if such top contact layers are made highly reflecting—without significantly compromising their current spreading ability. This disclosure proposes device structures that provide such dual functionalities.

In one form of the presently described embodiments, an LED structure utilizes a mesh or grid pattern as a part of a top metal or conductive layer. The mesh or grid pattern allows current to be distributed across the top contact area while providing open spaces between the grids on which a highly reflective mirror can be formed. High reflectivity for the top layer is achieved by improving (e.g., optimizing) the relative fill factor of open areas to alloyed mesh contact areas. The alloyed mesh or grid pattern allows electrical current to be distributed across the entire top contact area.

Figure 1:
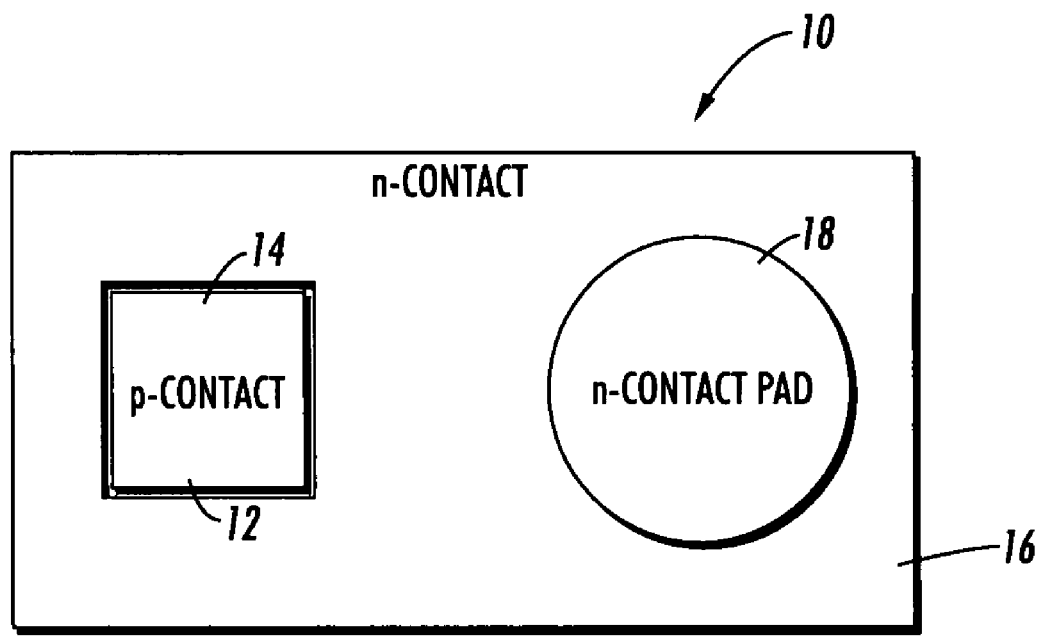
FIG. 1 is a top view of a prior art LED.
Figure 2:
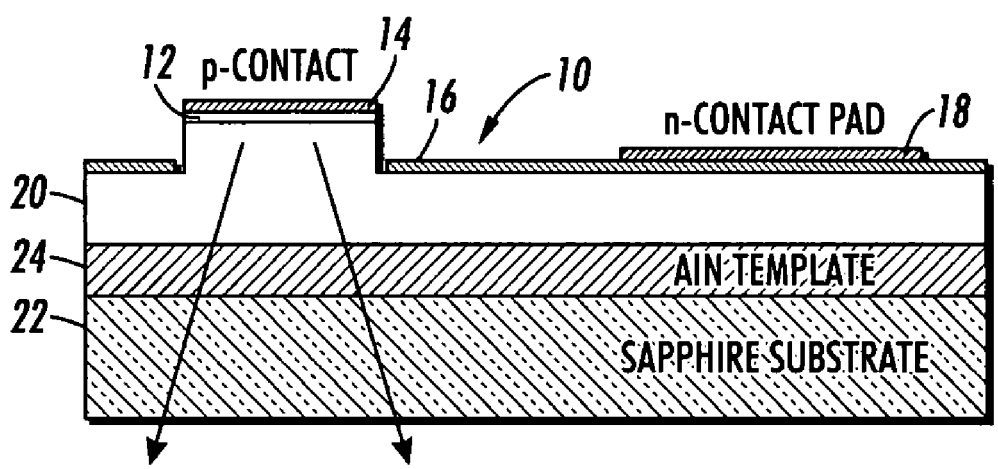
FIG. 2 is a cross-sectional view of the LED of FIG. 1.
Figure 3:
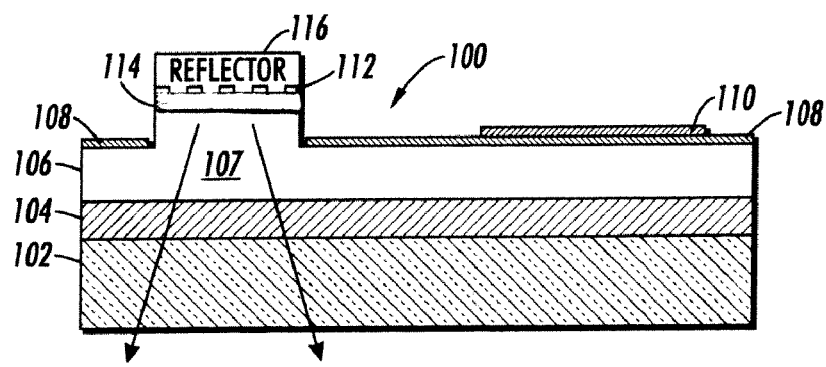
FIG. 3 is a cross-sectional view of an LED according to the presently described embodiments.

Referring now to FIG. 3, one form of the presently described embodiments is shown. As illustrated, a light emitting diode 100 includes a substrate layer 102 and a template layer 104. The substrate layer 102 may be formed of a variety of different materials, including sapphire. Likewise, the template layer 104 may be formed of a variety of different materials, including aluminum nitride.

A plurality of epitaxial layers 106 comprise a light-emitting active region 107, an n-contact layer 108 and a p-contact layer 114. The details of an LED epitaxial structure 106 are well known in the art (see, for example, U.S. Pat. Nos. 6,233,265 and 6,618,413, both of which are incorporated herein by reference) and so are not described here. In one embodiment, a conductive (or metal) contact or layer 112 comprises a layer of Nickel (Ni) followed by gold (Au). The layer stack is then heated and made to alloy with an underlying GaN p-contact layer 114. The n-contact layer 108 can be a stack comprising of Aluminum (Al) followed by gold (Au). Like the p-contact, the n-contact is formed by heating and alloying the n-contact layer 108 into an underlying n-contact layer.

Notably, the metal layer 108 has an n-contact pad 110 formed thereon to facilitate device packaging. As shown, the p-contact metal or conductive layer 112 is provided with at least one aperture (e.g., a plurality of apertures) that defines a mesh pattern or grid. A reflector 116, aligned with the mesh pattern is also provided to the devices.

To form the device of FIG. 3, the conductive layer 112 is deposited on the epitaxial layer such that the conductive layer has defined therein a contact area having a plurality of apertures. The conductive layer may be formed of, for example, a metal or a conductive oxide. A reflector is then formed on the metal conductive layer, the reflector being aligned with the plurality of apertures of the contact area. The reflector 116 may take a variety of forms but, in one form(s), can be a simple non-alloyed metal such as silver, aluminum or gold. The reflector 116 may also be comprised of a dielectric, such as $SiO_x$, $SiN_x$ or ITO, and a metal formation, such as a cap, to further enhance reflectivity. Alternatively, Distributed Bragg Reflectors (DBRs) consisting of alternating layers of dielectric pairs can be employed. Of course, the techniques used to form the layers and the reflector 116 are well known to those skilled in the art.

The reflectivity could be improved, e.g. optimized, by choosing appropriate thicknesses of reflector materials. For a 325 nm UV LED, for example, various reflector materials and thicknesses may be selected. The thickness choices may vary as a function of the presence of, in one embodiment, an absorbing 20 nm thick top p-GaN contact 114. This GaN top layer is, of course, considered by many to be essential for adequate electrical contacting.

Different reflector designs employing a variety of different materials can be used. For example, without a reflector, only about 11% of upward-directed light is reflected. A simple reflector consisting of an unalloyed metal such as Al, Ag or Au significantly increases reflectivity. Such a metallic reflector can be easily evaporated and has the additional advantage of being electrically conducting, so current distribution is improved. For example, a 300 nm layer of Au, for example, boosts the reflectivity at the reflector region to about 56%.

The performance of simple metal reflectors can be improved by inserting a dielectric such as $SiO_2$, $ZrO_2$, $HfO_2$, $Si_3N_4$, $TiO_2$, $Ta_2O_5$ or $Al_2O_3$ between the top metal of the reflector 116 and the GaN surface of the p-contact 114. The percentages of elements in the dielectrics are nominal values. The actual compositions can vary from the nominal values depending on material deposition methods and conditions. For this reasons, $SiO_2$ is sometimes labeled as $SiO_x$, $Si_3N_4$ is sometimes labeled as $Si_xN_y$, and so on. For example, a 0.4-lambda thick $SiO_2$ (54.8 nm thick for λ=325 nm LEDs) followed by a 300 nm thick Au increases the reflectivity to about 90%. The preferred dielectric material and its corresponding optimized layer thickness would differ from material to material and from design to design, so it will have to be determined for each device structure chosen. A transparent conductive film such as Indium Tin Oxide (ITO) or Zinc Oxide (ZNO) can be used in place of the dielectric to improve current spreading.

Distributed Bragg Reflectors (DBRs) consisting of pairs of alternating materials such as $SiO_2$, $ZrO_2$, $HfO_2$, $Si_3N_4$, $TiO_2$, $Ta_2O_5$ or $Al_2O_3$ can also be employed. Again, the percentages of elements in the dielectrics are nominal values. The actual compositions can vary from the nominal values depending on material deposition methods and conditions. A 5-pair quarter-wave thick $SiO_2/ZrO_2$ DBR produces a reflectivity of about 55% at the design wavelength of 325 nm. The GaN contact layer 114 shifts the reflectivity spectrum of the DBR so the maximum reflectivity occurs at a slightly longer wavelength than the design wavelength. Increasing the thickness of each layer in every pair to 0.28-lambda shifts the reflectivity spectrum so a maximum reflectivity of 65% results at the design wavelength of 325 nm. Other types of mirrors can be designed. For example, a metal cap can be placed above a dielectric DBR, or an optical phase shifting dielectric layer can be placed between the GaN contact layer and a DBR.

It should also be understood that if reflectivity of the reflector is selected to be sufficiently high, the light emitting device contemplated herein may take the form of a surface-emitting laser.

Figure 4:
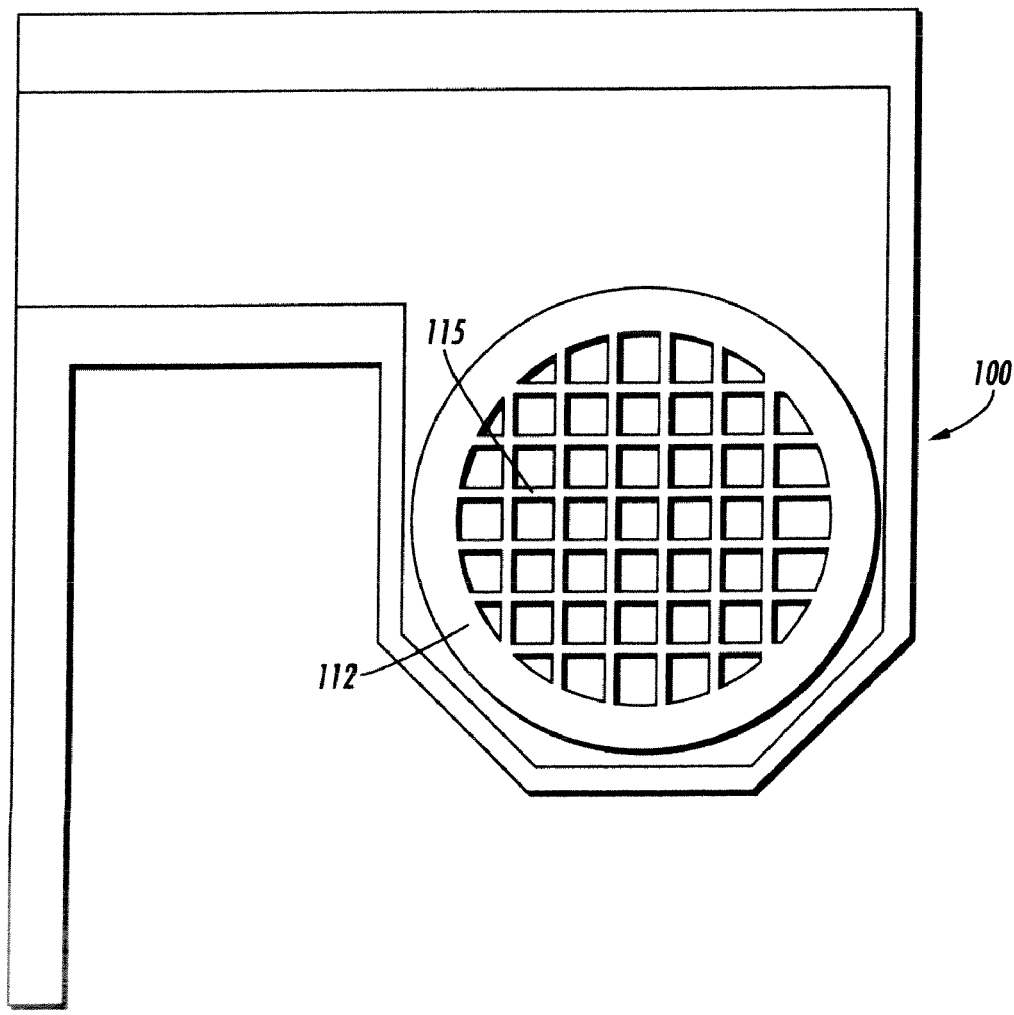
FIG. 4 is a top view of the LED of FIG. 3.

A structure featuring a rectangular grid pattern for the mesh is shown in FIG. 4. As shown, the device 100 includes a conductive layer 112 having a mesh or grid area 115 corresponding to the p-contact area. The resulting current distribution is relatively uniform. Note that the reflector 116 is not illustrated here. Also, the n-contact pad 110 is not shown. In some forms, the n-contact pad may be located remotely from the p-contact pad.

Figure 5:
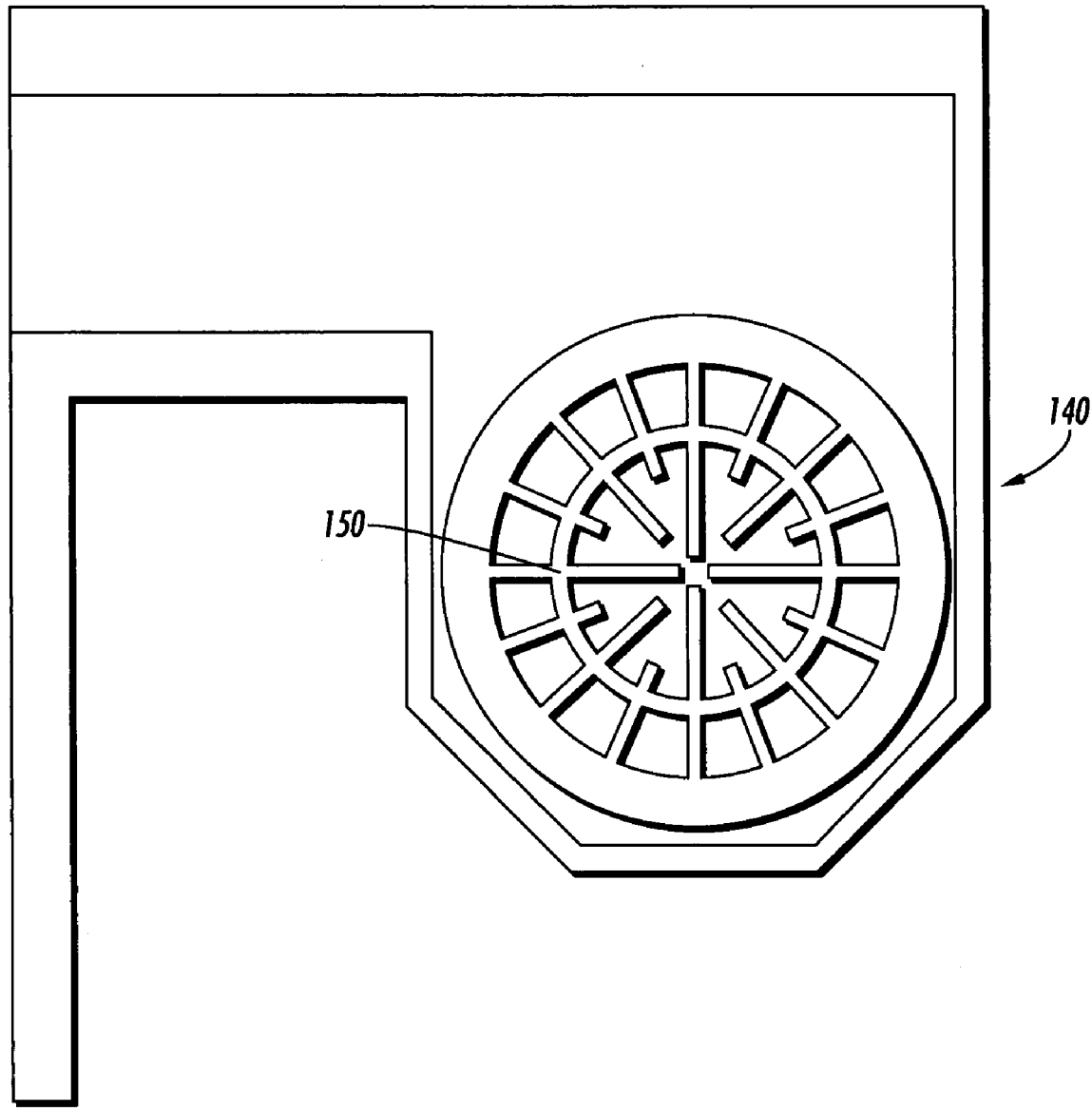
FIG. 5 is a top view of another LED according to the presently described embodiments.

FIG. 5 shows an alternative mesh design featuring a radially symmetric grid 150 implemented on a device 140. As with FIG. 4, a grid pattern is also employed in connection with the n-contact pad. This alternative likewise results in effective current distribution. It should be understood that the form of the mesh or grid design may vary, so long as suitable current distribution is achieved.

According to the presently described embodiments, a bottom-emitting nitride LED with enhanced light extraction efficiency is provided. The increased light output is provided by the reflector that redirects upward going light towards the bottom output. The mesh contact area, in one form, spreads current across the entire carrier injection area without occupying the entire top surface of the device. This allows the reflectors to be placed in areas between the grid to advantageously perform as noted above.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A nitride-based light emitting device comprising:
a conductive layer disposed on a top epitaxial layer of the light emitting device, the conductive layer being formed of a metal or metal oxide, having defined therein a contact area having a plurality of apertures and being operative to distribute current across the contact area; and,
a reflector aligned with the contact area.

2. The light emitting device as set forth in claim 1 wherein the conductive layer is alloyed to the epitaxial layer.

3. The light emitting device as set forth in claim 1 wherein the reflector comprises a metal.

4. The light emitting device as set forth in claim 1 wherein the reflector comprises a dielectric.

5. The light emitting device as set forth in claim 1 wherein the reflector comprises at least one of silver, aluminum, gold, $SiO_x$, $Si_xN_y$, $ZrO_x$, $HfO_x$, $TiO_x$, $Ta_xO_y$, $Al_xO_y$, ZnO, ITO and a dielectric material.

6. The light emitting device as set forth in claim 1 wherein the plurality of apertures defines a mesh pattern in the contact area.

7. The light emitting device as set forth in claim 1 wherein the plurality of apertures defines a radially symmetric grid pattern in the contact area.

8. The device of claim 1 where the device is a light-emitting diode.

9. The device of claim 1 where the device is a surface-emitting laser.

10. A light emitting device comprising:
a substrate layer;
a template layer positioned on the substrate layer;
a plurality of nitride-based epitaxial layers on the template layer comprising a light generating active layer and a contact layer;
a conductive layer on the said contact layer, the conductive layer being formed of metal or metal oxide and being operative to distribute current across a contact area and to excite the said active layer to generate the light, and the conductive layer having defined therein the contact area having at least one aperture; and,
a reflector aligned with the contact area, the reflector being operative to reflect the generated light through the contact area, the epitaxial layers, the template layer and the substrate layer.

11. The light emitting device as set forth in claim 10 wherein the template layer comprises $Al_xGa_{1-x}N$, where $0 \leq x \leq 1$.

12. The light emitting device as set forth in claim 10 wherein the reflector comprises at least one of silver, aluminum and gold.

13. The light emitting device as set forth in claim 10 wherein the reflector comprises a dielectric material.

14. The light emitting device as set forth in claim 10 wherein the reflector comprises at least one of $SiO_x$, $Si_xN_y$, $ZrO_x$, $HfO_x$, $TiO_x$, $Ta_xO_y$, $Al_xO_y$, ZnO and ITO material.

15. The light emitting device as set forth in claim 10 wherein the reflector comprises alternating layers of dielectric material.

16. The light emitting device as set forth in claim 10 wherein the at least one aperture defines a mesh pattern in the contact area.

17. The light emitting device as set forth in claim 10 wherein the at least one aperture defines a radially symmetric grid pattern in the contact area.

18. The device of claim 10 where the device is a light-emitting diode.

19. The device of claim 10 where the device is a surface-emitting laser.

20. A method for forming a nitride-based light emitting diode having multiple layers including a nitride-based epitaxial layer, the method comprising:
depositing a metal or metal oxide conductive layer on the epitaxial layer such that the conductive layer has defined therein a contact area having a plurality of apertures and is operative to distribute current across the contact area; and.

forming a reflector on the conductive layer, the reflector being aligned with the plurality of apertures of the contact area.

21. The method as set forth in claim 20 wherein the plurality of apertures defines a mesh pattern in the contact area.

22. The method as set forth in claim 20 wherein the plurality of apertures defines a radially symmetric grid pattern in the contact area.

* * * * *